US009369085B1

(12) United States Patent
Leong et al.

(10) Patent No.: US 9,369,085 B1
(45) Date of Patent: Jun. 14, 2016

(54) OSCILLATOR WITH FAVORABLE STARTUP

(71) Applicant: NXP B.V., Eindhoven (NL)

(72) Inventors: Frank Leong, Veldhoven (NL); Yuan Gao, Eindhoven (NL); Robert Bogdan Staszewski, Dublin (IE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/836,727

(22) Filed: Aug. 26, 2015

(51) Int. Cl.
*H03B 5/06* (2006.01)
*H03B 5/12* (2006.01)
*H03L 3/00* (2006.01)

(52) U.S. Cl.
CPC ............ *H03B 5/1212* (2013.01); *H03B 5/06* (2013.01); *H03B 5/1225* (2013.01); *H03B 5/1228* (2013.01); *H03B 5/1262* (2013.01); *H03B 5/1268* (2013.01)

(58) Field of Classification Search
CPC .......... H03B 5/06; H03B 5/12; H03B 5/1206; H03B 5/1212; H03B 5/1225; H03B 5/1228; H03B 5/1262; H03B 5/1268; H03B 2200/0094; H03L 3/00
USPC ............... 331/117 FE, 117 R, 167, 173, 181; 375/369
See application file for complete search history.

(56) References Cited

U.S. PATENT DOCUMENTS 7,808,266 B2 * 10/2010 Marsall ............ G01R 31/2617
324/750.14
2004/0150485 A1 * 8/2004 Muramatsu .......... H03B 5/1228
331/117 R
2006/0033587 A1 * 2/2006 Cabanillas ........... H03B 5/1218
331/108 C
2009/0189706 A1 * 7/2009 Lee ..................... H03B 5/1228
331/181

OTHER PUBLICATIONS

J. Ryckaert et al., "A 0.65-to-1.4 nJ/Burst 3-to-10 GHz UWB All-Digital TX in 90nm CMOS for IEEE 802.15.4a." IEEE JSSC vol. 42, No. 12, pp. 2860-2869, Dec. 2007.
S. Drago et al., "A 200 uA duty-cycled PLL for wireless sensor nodes in 65 nm CMOS." IEEE JSSC, vol. 45, No. 7, pp. 1305-1315, Jul. 2010.
Andreani P., et al., "A TX VCO for WCDMA/EDGE in 90 nm RF CMOS" IEEE JSSC, vol. 46, No. 7, Jul. 2011.
Chen, Y. et al., "A 9 GHz Dual-Mode Digitally Controlled Oscillator for GSM/UMTS Transceivers in 65 nm CMOS", IEEE Asian Solid-State Circuits Conference, Nov. 12-14, 2007; Jeju, Korea.
Chillara V. K. et al., "An 860uW 2.1-to-2.7GHz All-Digital PLL-Based Frequency Modulator with a DTC-Assisted Snapshot TDC for WPAN (Bluetooth Smart and ZigBee) Applications", IEEE International Solid-State Circuits Conference, Session 9, 2014.

(Continued)

*Primary Examiner* — Levi Gannon
(74) *Attorney, Agent, or Firm* — Rajeev Madnawat

(57) ABSTRACT

In an example embodiment, an apparatus includes an LC circuit having a capacitive circuit and an inductive circuit connected in a circuit loop. The inductive circuit includes one or more inductive elements and a switching circuit. In a first mode, the switching circuit provides a direct-current charge voltage across the LC circuit and prevents oscillation of energy between the capacitive circuit and the inductive circuit by opening a switch in the circuit loop of the LC circuit. In a second mode, the switching circuit enables oscillation of energy between the capacitive circuit and the inductive circuit by closing the switch in the circuit loop.

20 Claims, 9 Drawing Sheets

(56) References Cited

OTHER PUBLICATIONS

Fanori L. et al., "A Class-D CMOS DCO with an on-chip LDO", IEEE 2014.

Marucci G. et al., "A 1.7GHz MDLL-Based Fractional-N Frequency Synthesizer with 1.4ps RMS Integrated Jitter and 3mW Paoer Using a 1b TDC", 2014 IEEE International Solid-State Circuits Conference.

* cited by examiner

OSCILLATOR WITH FAVORABLE STARTUP

OVERVIEW

Aspects of various embodiments relate generally to electronic systems and methods for operating the electronic systems and, more particularly, to oscillator architectures and methods for operating the oscillator architectures.

Impulse Radio Ultra Wide-Band (IR-UWB) is an increasingly popular technique for radio frequency (RF) communication. In IR-UWB radios, signals can be transmitted in the form of short pulses (or short bursts consisting of several back-to-back pulses grouped closely together in time for each burst), where the burst duration is on the order of nanoseconds while the pulse repetition rate is on the order of microseconds. Data can be encoded by changing either the phase, the amplitude, the frequency or the position of pulses realizing respectively the well-known modulation schemes of phase shift keying (PSK), amplitude shift keying (ASK) such as pulse amplitude modulation (PAM) or on-off keying (OOK), frequency shift keying (FSK), or pulse-position modulation (PPM).

IR-UWB transmitters and/or receivers may reduce energy use by duty-cycling oscillators and/or other components in the transmitter and/or receiver. Duty-cycling places the oscillator or other components in an inactive or powered down state for a significant fraction of the time in use (e.g., between transmitted pulses). However, oscillator circuits require a certain time period to start-up before the generated signal may be used for applications requiring high accuracy. In applications that duty-cycle circuits including oscillators, this startup time becomes an important component in the total power consumption of the electrical system. In some applications, the start-up time dictates whether the chip can power down fully, or must remain powered on in order to respond quickly to interruptions or other events.

Applications that duty-cycle oscillators typically utilize ring-oscillators. Ring oscillators are known to be less energy efficient than LC oscillators, in the sense that they require more power for a given phase noise level. However, ring-oscillators can be made in such a way that they suit instantaneous startup. While LC oscillators are energy efficient, LC oscillators typically start from a random phase and need many cycles to reach steady-state amplitude and frequency.

These and other matters have presented challenges to efficiencies of frequency synthesizer implementations, for a variety of applications.

SUMMARY

Various example embodiments are directed to apparatuses and methods for generating oscillating signals. According to an example embodiment, an apparatus includes an LC circuit having a capacitive circuit and an inductive circuit connected in a circuit loop. The inductive circuit includes one or more inductive elements and a switching circuit. In a first mode, the switching circuit provides a direct-current (DC) charge voltage across the LC circuit and prevents oscillation of energy between the capacitive circuit and the inductive circuit by opening a switch in the circuit loop of the LC resonant circuit. In a second mode, the switching circuit enables oscillation of energy between the capacitive circuit and the inductive circuit by closing the switch in the circuit loop.

According to another example embodiment, a method is provided for operating an oscillator circuit including a capacitive circuit and an inductive circuit connected in a circuit loop. In a first mode, the oscillation of the LC circuit is prevented by opening a switch in the circuit loop of the LC circuit. The capacitive circuit is also charged in the first mode by providing a charge voltage across the LC circuit. The charge in the capacitive circuit causes the LC circuit to oscillate with a single-ended peak-to-peak amplitude that equals the pre-charged voltage of the capacitive circuit nearly instantaneously once the oscillation of the LC circuit is enabled. In a second mode, the oscillation of the LC circuit is enabled by closing the switch in the circuit loop.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
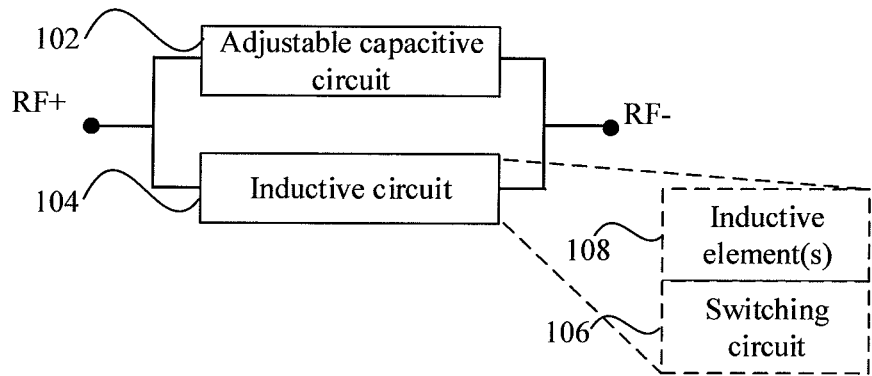
FIG. 1 shows a block diagram for an oscillator circuit, consistent with one or more embodiments of the present disclosure.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems, and methods involving oscillator circuits. In certain implementations, aspects of the present disclosure have been shown to be beneficial when used in the context of applications involving duty-cycled operation of oscillator circuits. While not necessarily so limited, various aspects may be appreciated through a discussion of examples using such exemplary contexts.

Various example embodiments are directed to energy-efficient oscillator circuits that exhibit near instantaneous startup. According to an example embodiment, an apparatus includes an LC circuit coupled to a first output node and a second output node. The LC circuit includes a capacitive circuit and an inductive circuit connected in a circuit loop. The inductive circuit includes one or more inductive elements (e.g., inductor coils) and a switching circuit. In a first mode, the switching circuit prevents oscillation of energy between the capacitive circuit and the inductive circuit by opening a switch in the circuit loop of the LC circuit and provides a DC charge voltage across the LC circuit—thereby charging the capacitive circuit. In a second mode, the switching circuit enables oscillation of energy between the capacitive circuit and the inductive circuit by closing the switch in the circuit loop. In some implementations, the apparatus also includes an amplifier circuit configured to reinforce and control oscillation of the LC circuit. The amplifier circuit may include, for example, a pair of cross-coupled inverter circuits. A first inverter circuit of the pair has an input coupled to the first output node and an output coupled to the second output node. A second inverter circuit of the pair has an input coupled to the output of the first inverter circuit, and an output coupled to the input of the first inverter circuit.

The LC circuit may be implemented using various inductive and capacitive circuit arrangements. In some embodiments, the inductive circuit includes first and second magnetically coupled inductor coils. The first inductor coil has a first end coupled to the first output node and a second end coupled to the switching circuit. The first inductor coil has a first end coupled to the second output node and a second end coupled to the switching circuit.

In the first mode, the switching circuit uncouples the second end of the first inductor coil from the second end of the second inductor coil—thereby opening the circuit loop of the LC circuit and preventing oscillation. In the first mode, the switching circuit also couples the second end of the first inductor coil to a first power terminal (e.g., a node providing a supply voltage), and couples the second end of the second inductor coil to a second power terminal (e.g., a node providing ground). After an initial charging period, node RF+ is pulled up to Vdd and node RF− is pulled down to Ground. As a result, a voltage difference is provided across the capacitive circuit. In the second mode, the switching circuit uncouples the second end of the first inductor coil from the first power terminal and uncouples the second end of the second inductor coil from the second power terminal. The switching circuit also couples the second end of the first inductor coil to the second end of the second inductor coil—thereby closing the circuit loop of the LC circuit and enabling oscillation.

It is recognized that a significant component of power consumption in a PLL can be from the RF oscillator circuit. Embodiments of the present disclosure are directed toward the use of LC oscillator circuits, which can require less power for a given phase noise level, when compared to other oscillator circuits, such as inverter-based ring oscillator circuits. Various aspects also recognize that LC oscillators can start from a random phase and may need many cycles to reach a steady-state amplitude and frequency. Various embodiments allow for the reduction of phase noise, relative to a ring oscillator with comparable power consumption, by one or even over two orders of magnitude, and for lower sensitivity to supply variations. Consistent with embodiments and in addition to reduced power in the oscillator circuit itself, power can be saved in subsequent circuits that receive the RF signal from the oscillator circuit.

The frequency of oscillation is primarily determined by the inductance and capacitance provided by the inductive and capacitive circuits. In various implementations, the capacitive circuit may provide a fixed capacitance between the first and second output nodes or may be programmable to adjust the capacitance and thereby tune a self-resonant frequency of the LC circuit. Similarly, in various implementations, the inductive circuit may provide a fixed inductance or may be configured to provide a programmable inductance.

The disclosed oscillator circuits may be adapted for use in various duty-cycled applications. As an illustrative example, in some applications, the oscillator circuit can be used for wireless transmission of impulse RF signals. For instance, the RF signal from the oscillator circuit can be selectively presented, in an enabled state, to an antenna to produce impulses. The oscillator circuit can be transitioned from the enabled state to a disabled state between the pulses to save power. Particular embodiments relate to an IR-UWB communication system (e.g., a transmitter or a receiver) that may include an oscillator circuit that is configured for fast startup to correspond to duty cycling for the pulses of the IR-UWB communications, consistent with one or more disclosed embodiments. The IR-UWB transmitter or receiver can include a duty-cycle control circuit that is configured to disable, or power down, the oscillator circuit between pulses of a communicated RF signal. Prior to enabling the oscillator circuit, the duty cycle control circuit can pre-charge the capacitive circuit using a switching circuit, consistent with various embodiments discussed herein. An example IR-UWB communication system is described in more detail with reference to FIG. 8.

Turning to the figures, FIG. 1 shows a block diagram for an oscillator circuit, consistent with one or more embodiments of the present disclosure. In this example, the oscillator circuit includes a capacitive circuit 102 and an inductive circuit 104 connected in a circuit loop to form an LC circuit. When the circuit loop is closed, energy transfers back and forth between the capacitive circuit 102 and/or the inductive circuit 104—thereby generating an oscillating signal at outputs RF+ and RF−. The inductive circuit 104 includes one or more inductive elements 108 and a switching circuit 106. In a first mode, a switching circuit 106 prevents oscillation of energy between the capacitive circuit 102 and the inductive circuit 104 by opening a switch (not shown) in the circuit loop of the LC circuit. In the first mode, the switching circuit 106 also charges the capacitive circuit 102 by providing a DC charge voltage across the LC circuit. In a second mode, the switching circuit 106 closes the switch in the circuit loop to enable the oscillation of energy between the capacitive circuit and the inductive circuit.

Consistent with embodiments, the inductive elements 108 can include two separate inductive elements and the switching circuit 106 can include a switch connected in between the two inductor elements. Various aspects are based upon the recognition that the AC voltage swing across an LC circuit decreases towards the center of the inductor circuit. Accordingly, enabling/preventing oscillation using a switch in-between two inductive elements limits influence of the switch on the tuning range of the LC circuit.

Figure 2:
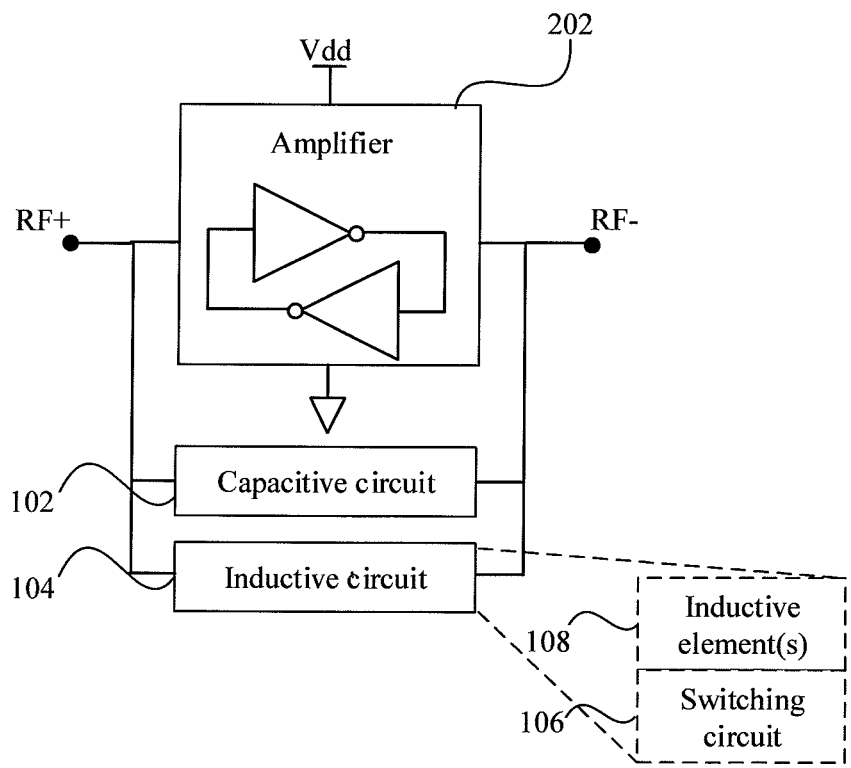
FIG. 2 shows a block diagram for an oscillator circuit that includes an amplifier circuit, consistent with one or more embodiments of the present disclosure.

FIG. 2 shows a block diagram for an oscillator circuit that includes an amplifier circuit, consistent with one or more embodiments of the present disclosure. The oscillator circuit includes a capacitive circuit 102 and an inductive circuit 104 connected in a circuit loop as described with reference to FIG. 1. In this example, the oscillator also includes an amplifier circuit 202 configured to reinforce and control the oscillation of the LC circuit so that the oscillation may be sustained. In some implementations, the amplifier includes a pair of cross coupled inverters. Each inverter of the pair has an input coupled to an output of the other inverter. Switching by the inverters prevents dampening of the oscillation signal. Consistent with embodiments, the switching circuit 106 can be configured to break the circuit loop in the LC circuit formed by the adjustable capacitive circuit 102 and the inductive circuit 104 such that oscillation is prevented and the adjustable capacitive circuit 102 is pre-charged to a steady-state voltage.

Figure 3:
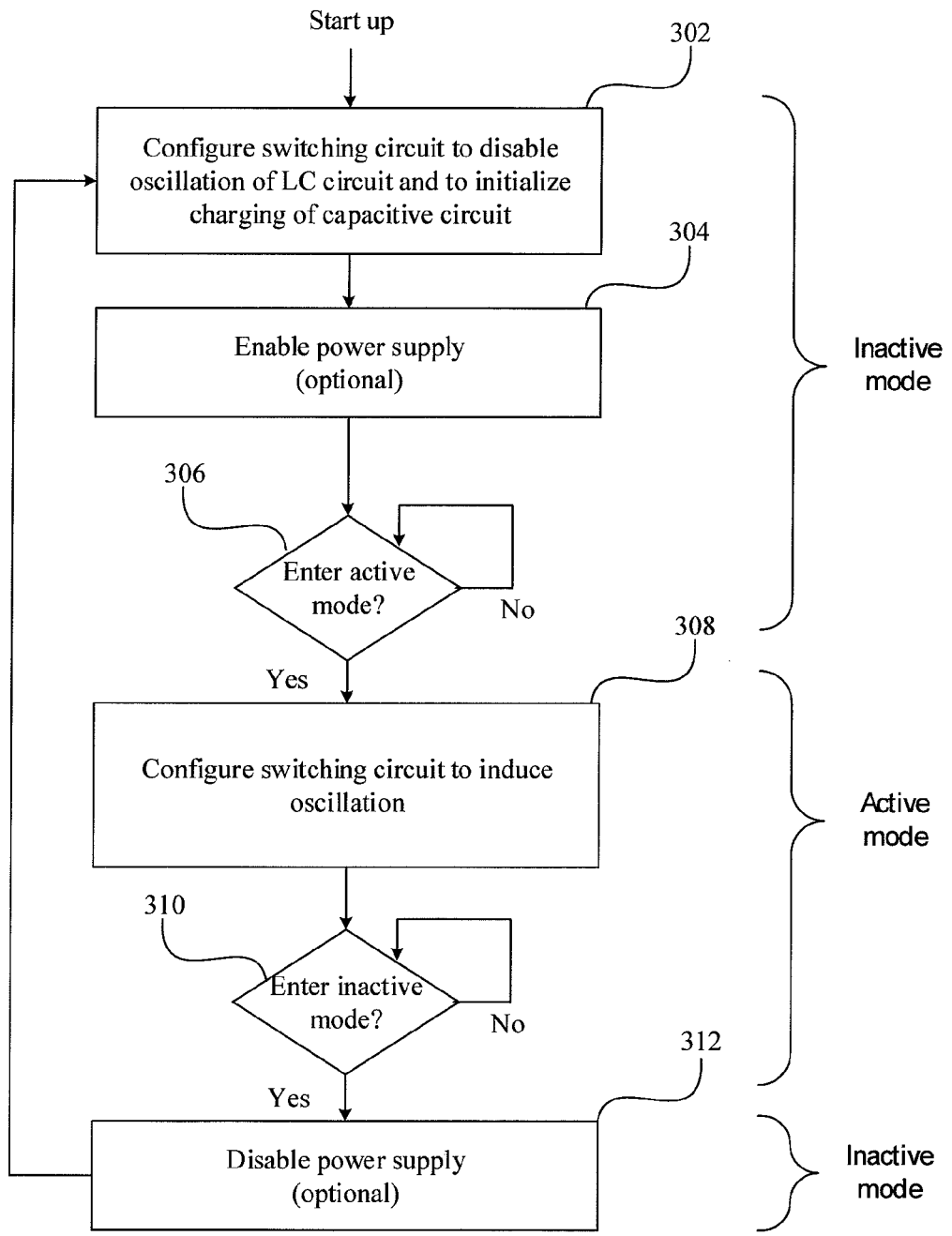
FIG. 3 shows a flow diagram for operating an oscillator circuit, consistent with one or more embodiments of the present disclosure.

FIG. 3 shows a flow diagram for operating an oscillator circuit, consistent with one or more embodiments of the present disclosure. At system startup, the oscillator enters an inactive mode beginning at block 302. At block 302, a switching circuit is configured to prevent oscillation of an LC circuit, for example, by opening a circuit loop in the LC circuit. As described in more detail with reference to FIG. 4, a circuit loop may be opened by a switch in response to setting an enable signal (e.g., EN) to logic 0 and closed in response to setting the enable signal to logic 1. Also at block 302, the switching circuit configured to initiate charging of a capacitive circuit in the LC circuit.

In some implementations, a power supply may be enabled at block 306 (if disabled). For example, a power supply used to power the oscillator may be powered down or disabled, when the oscillator is inactive. In some other embodiments, the power supply may remain powered up and/or enabled, when the oscillator is inactive. A small ramp-up time may be needed by the power supply to transition from a disabled/powered down to an enabled/powered up state (e.g., to drive a supply terminal from 0 volts to Vdd). During the ramp-up of the power supply, the configuration of the switching circuit at block 302 causes a charge voltage to be presented across the adjustable capacitive circuit of the LC circuit.

In response to a command to operate the oscillator in an active mode, decision block 306 directs the process to block 308. At block 308, the switching circuit is configured to enable the oscillation of the LC circuit (e.g., by closing the circuit loop of the LC circuit). Due to the charge on the capacitor provided at block 302 and/or block 304, full amplitude oscillation is induced in the LC circuit nearly instantaneously (e.g., within one oscillation cycle). The oscillation continues until a command is received to operate the oscillator in an inactive mode. In response to a command to operate the oscillator in an inactive mode, decision block 310 directs the process to configure the switching circuit to prevent oscillation of the LC circuit at block 302. In some embodiments, the process may disable a power supply at block 314 before proceeding to block 302.

Figure 4:
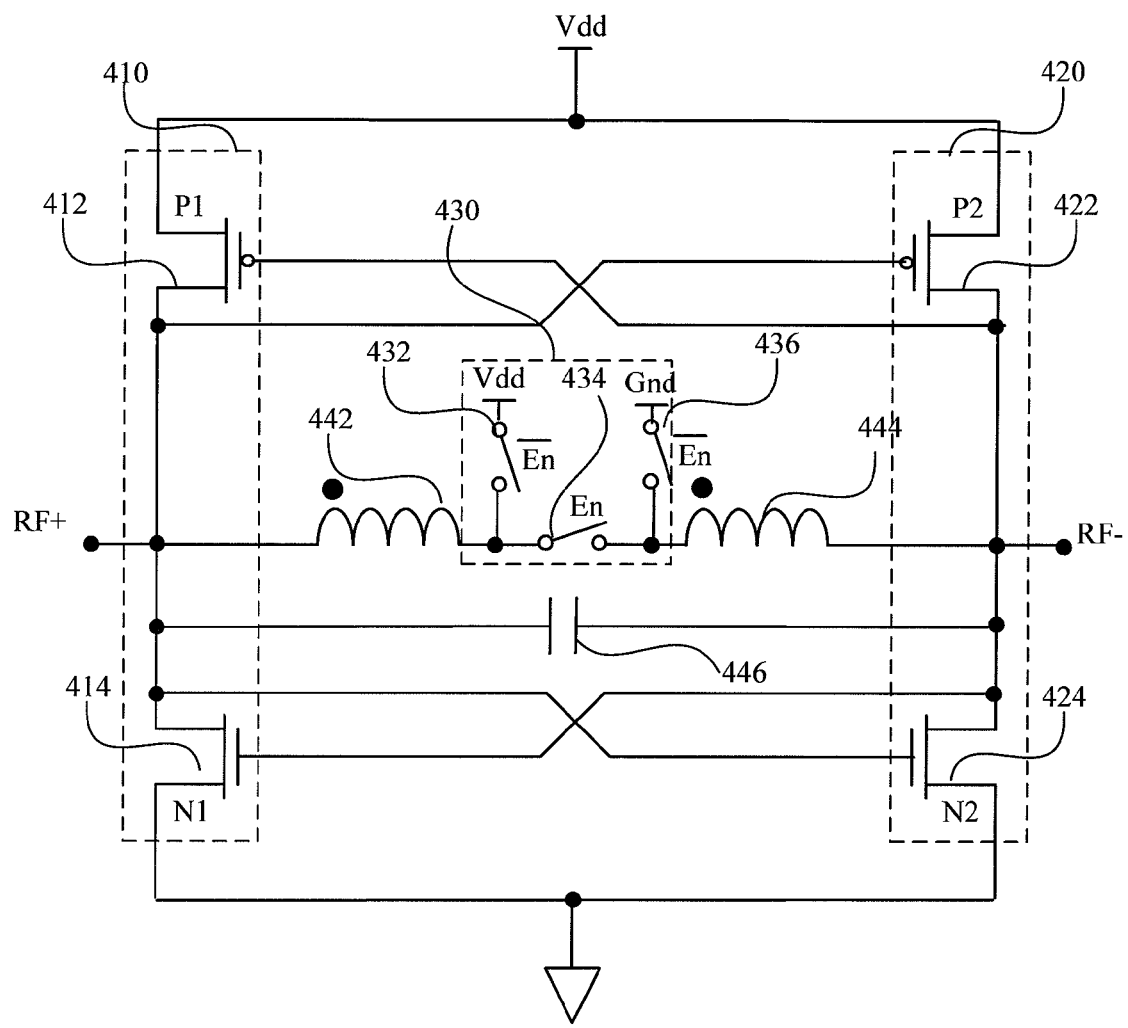
FIG. 4 shows an oscillator circuit with switching circuits, consistent with one or more embodiments of the present disclosure.

When a single-ended peak amplitude is used, the ideal amplitude of the oscillator can be equal to half of the supply voltage, which is used to drive the oscillator circuit. If a differential peak amplitude or a single-ended peak-to-peak amplitude is used, the ideal amplitude can be equal to the full supply voltage. For a differential peak-to-peak amplitude, the ideal amplitude can be equal to double the full supply voltage. It is recognized that the exact amplitude of oscillation can be slightly less than the ideal amplitude. 100351 FIG. 4 shows an oscillator circuit, consistent with one or more embodiments of the present disclosure. The oscillator includes a capacitive circuit 446 and an inductive circuit including inductive elements 442 and 444 and a switching circuit 430 configured as discussed with reference to the capacitive circuit 102 and inductive circuit 104 shown in FIGS. 1 and 2. In this example, the oscillator also includes an amplifier having a pair of cross-coupled inverters 410 and 420 as described with reference to amplifier 202 shown in FIG. 2. In this example, each of the inverters 410 and 420 includes a P-type pull-up transistor 412 and 422 having a source coupled to a first power terminal (Vdd) and a drain coupled to a respective one of the output nodes: RF+ and RF−. Each of the inverters 410 and 420 also includes an N-type pull-down transistor 414 and 424 having a source coupled to a second power terminal (Ground) and a drain coupled to the respective one of the output nodes of the oscillator circuit (indicated by nodes RF+ and RF−). Node RF+ is connected to an output of the inverter 410 and RF− is connected to an output of inverter 420. The input of the inverter 410 is connected to the gates of transistors 412 and 414. The input of the inverter 410 is coupled to the output node (RF−). Gates of transistors 422 and 424 form an input node of the inverter 420, which is coupled to the output node (RF+) of the inverter 410.

As previously described, the inverters 410 and 420 are configured to sustain oscillation of the LC circuit. For instance, when the voltage of the node RF+ rises above a first threshold voltage, transistor 424 reinforces the oscillation signal by pulling the node RF− down to the voltage of the second power terminal (Ground), which causes and transistor 412 to pull the node RF+ up to the voltage of the first power terminal (Vdd). Conversely, when voltage of node RF− rises above the first threshold voltage, transistor 414 reinforces the oscillation signal by pulling the node RF+ down to the voltage of the second power terminal (Ground), which causes transistor 422 to pull the node RF− up to the voltage of the first power terminal (Vdd).

As previously discussed, the oscillator circuits may be implemented using various inductive and capacitive circuits. In this example, the inductive circuit includes two magnetically-coupled inductor coils 442 and 444. The magnetic coupling of the inductor coils 442 and 444 is illustrated using dot notation in FIG. 4. A first one of the inductors 442 has a first end coupled to a first output node RF+ and a second end coupled to the switching circuit 430. A second one of the inductor coils 444 has a first end coupled to a second output node RF− and a second end coupled to the switching circuit 430.

The switching circuit 430 includes a switch 434 configured to couple the second end of the inductor coil 442 to the second end of the inductor coil 444 when closed. A second switch 432 is configured to couple inductor coil 442 to the first power terminal (Vdd) when closed. A third switch 436 is configured to couple inductor coil 444 to the second power terminal (Ground) when closed.

In this example, the switching circuit 430 operates in a first mode in response to a first control signal (e.g., $\overline{\text{En}}$) and in a second mode in response to a second control signal (e.g., En). The $\overline{\text{En}}$ control signal is the logical inverse of the En control signal. In the first mode, switch 434 is opened and the LC circuit loop formed by the inductive circuit 442 and 444 and capacitive circuit 446 is opened. As a result, oscillation of energy between the inductive circuit 442 and 444 and the capacitive circuit 446 is prevented. In the first mode, switches 432 and 436 are closed, thereby coupling the second end of inductor 442 to the first power terminal (Vdd) and the second end of inductor 444 to the second power terminal (Ground). When a voltage difference (e.g., Vdd-Ground) is applied to the power terminals, current flows through the inductor coils, which pulls output node RF+ up to Vdd and pulls output node RF− down to Ground. As a result, inverters 410 and 420 are set to respectively hold output nodes RF+ and RF− at Vdd and Ground and capacitive circuit 446 is charged.

In the second mode, switches 432 and 436 are opened and switch 434 is closed. As a result, the LC circuit loop formed by the inductive circuit 442 and 444 and capacitive circuit 446 is closed. When the LC circuit loop is closed, oscillation of energy is induced between the inductive circuit 442 and 444 and capacitive circuit 446, thereby generating an oscillation signal at the output nodes RF+ and RF−. Due to the energy stored in the capacitive circuit while in the first mode, the oscillation signal oscillates at full amplitude nearly instantaneously (e.g., within the first oscillation cycle).

The circuit depicted in FIG. 4 is consistent with a complementary class-B LC oscillator. However, various embodiments are not necessarily limited to the specific configuration depicted in FIG. 4. For example, different embodiments are contemplated in which variations can be made to the specific configuration of the circuit configured to reinforce oscillation (e.g., inverter circuits 410 and 420).

Figure 5:
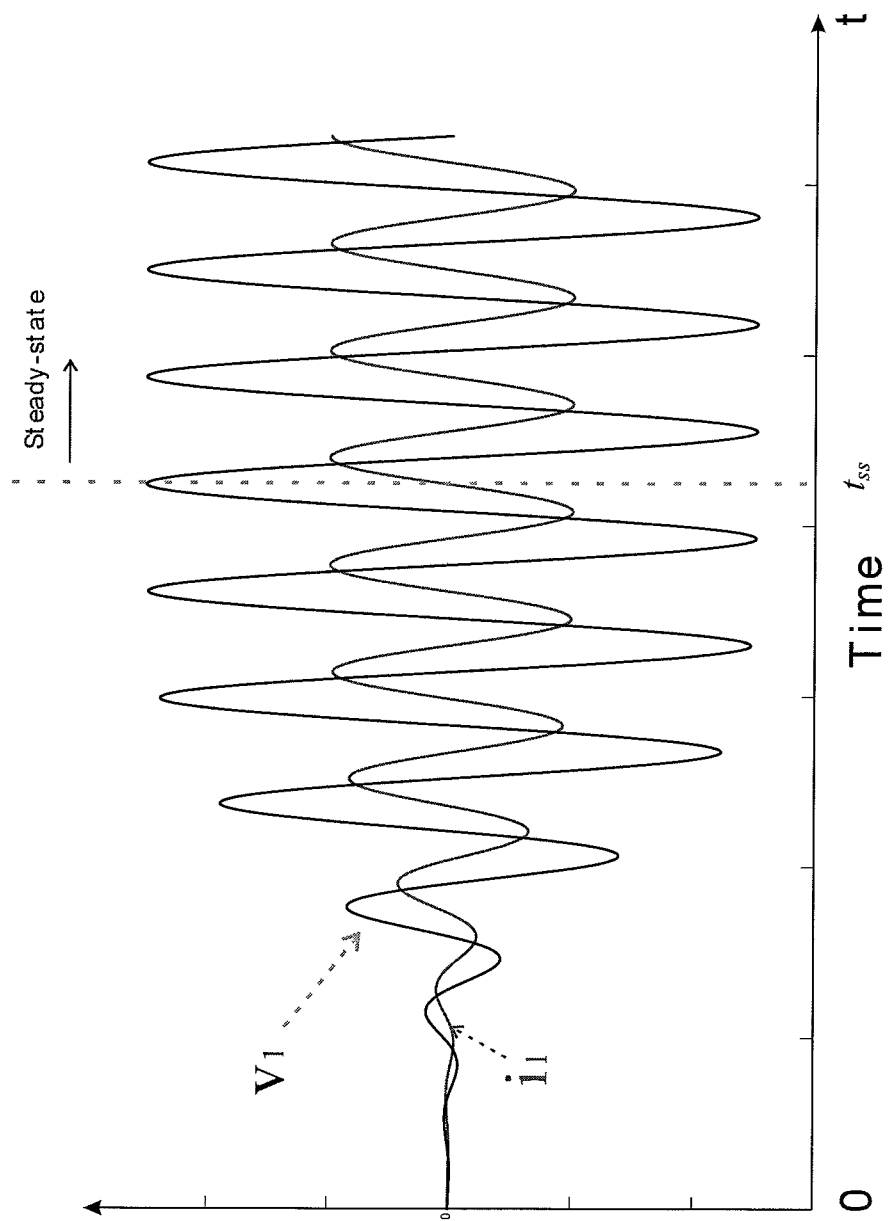
FIG. 5 shows a first set of waveforms illustrating startup of an oscillator circuit without pre-charging, consistent with one or more embodiments of the present disclosure.

FIG. 5 shows a first set of waveforms illustrating startup of an oscillator circuit that does not include a switching circuit to facilitate instantaneous startup. A first waveform (v1) shows voltage difference between the output nodes (e.g., node RF+ and node RF−) as a function of time. A second waveform (i1) shows current flow in an LC circuit loop as a function of time. In this example, startup of the oscillator occurs at time 0. At startup of the oscillator, the voltage begins to oscillate in response to random noise or other non-deterministic starting conditions. The amplitude of the oscillating voltage gradually increases over time until full amplitude (steady-state condition) is achieved at time t0. Similarly, the frequency is shown as varying until the steady-state condition is reached. For applications requiring a highly accurate oscillating signal, the oscillator may be powered and started up for a period of time, from 0 to t0, before the oscillation signal is used by the system.

Figure 6:
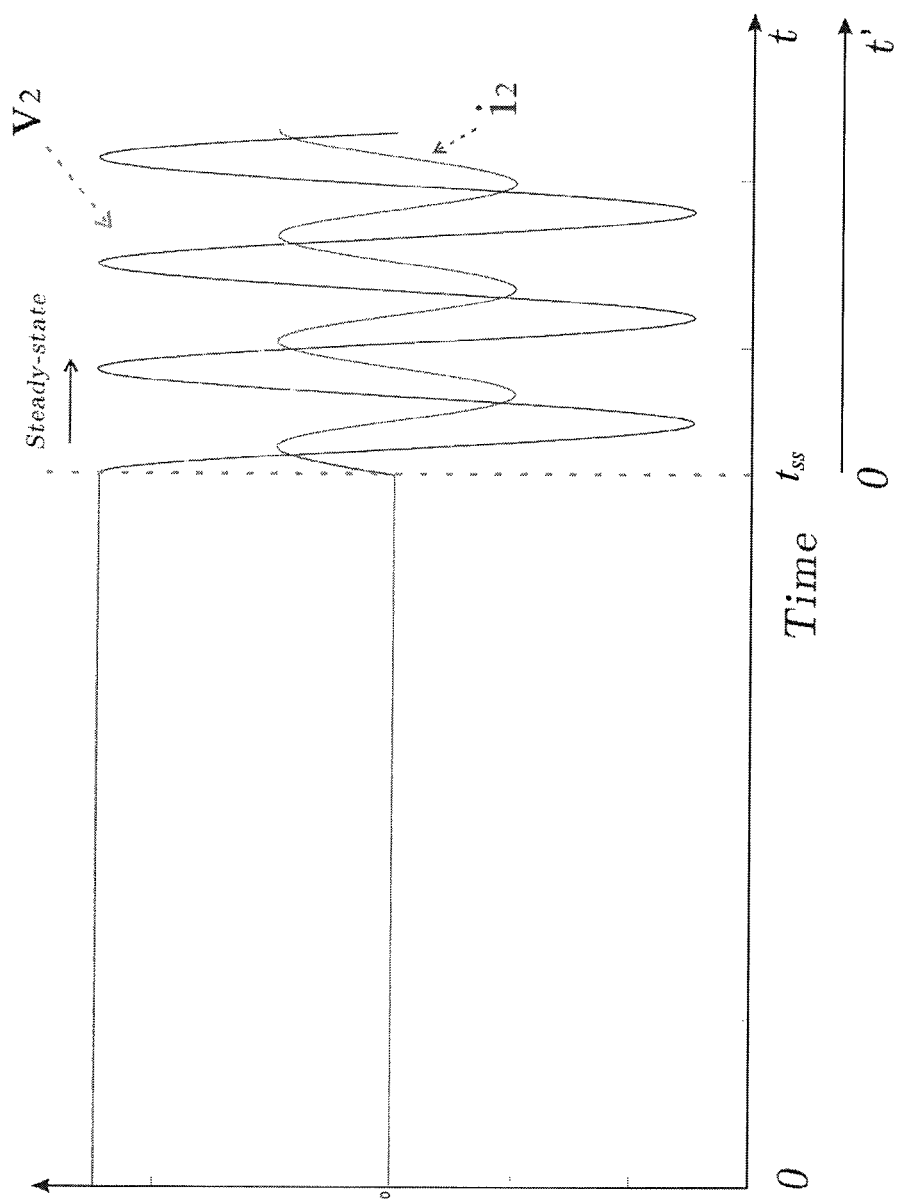
FIG. 6 shows a second set of waveforms illustrating startup of an oscillator circuit with pre-charging, consistent with one or more embodiments of the present disclosure.

FIG. 6 shows a second set of waveforms illustrating the startup of an oscillator circuit with pre-charging, consistent with one or more embodiments of the present disclosure. A first waveform (v2) shows the differential voltage of an oscillation signal generated at the output nodes (e.g., node RF+ and node RF−) as a function of time. A second waveform (i2) shows the current flow in an LC circuit loop as a function of time. In this example, the oscillator circuit is started up at time t0.

By charging the capacitive circuit, the oscillator circuit can be made to oscillate at full amplitude nearly instantaneously when started up. Due to the fact that an LC circuit is a second order system, its state has two degrees of freedom, i.e., its state can be fully characterized by either the current of the inductor and the voltage across the capacitor, or the current and its derivate of the inductor, or the voltage and its derivate of the capacitor. At the same time, the next state of the LC circuit is only dependent on its previous state. Accordingly, by charging the capacitive circuit prior to enabling the oscillation, the LC circuit is placed in the same state the LC circuit at time t0 in FIG. 5. At a result, when oscillation begins at time t0 in FIG. 6, the waveform matches the steady waveform in FIG. 5. Accordingly, the oscillator can be operated in an idle or powered down state until right before the oscillation signal is needed. Accordingly, the oscillator circuit can significantly reduce power use in applications that duty-cycle oscillator circuits relative to an oscillator circuit that requires a longer startup period.

As discussed herein, the time t0 can correspond to the transition of the signal En. Various embodiments therefore allow for the use of the oscillator circuit in connection with a PLL or frequency synthesizer that aligns the En signal with a reference clock by the PLL or frequency synthesizer. This allows for the first edge of the RF signal from the oscillator circuit to have a phase that is set relative to the reference signal at the initial startup conditions.

Figure 7:
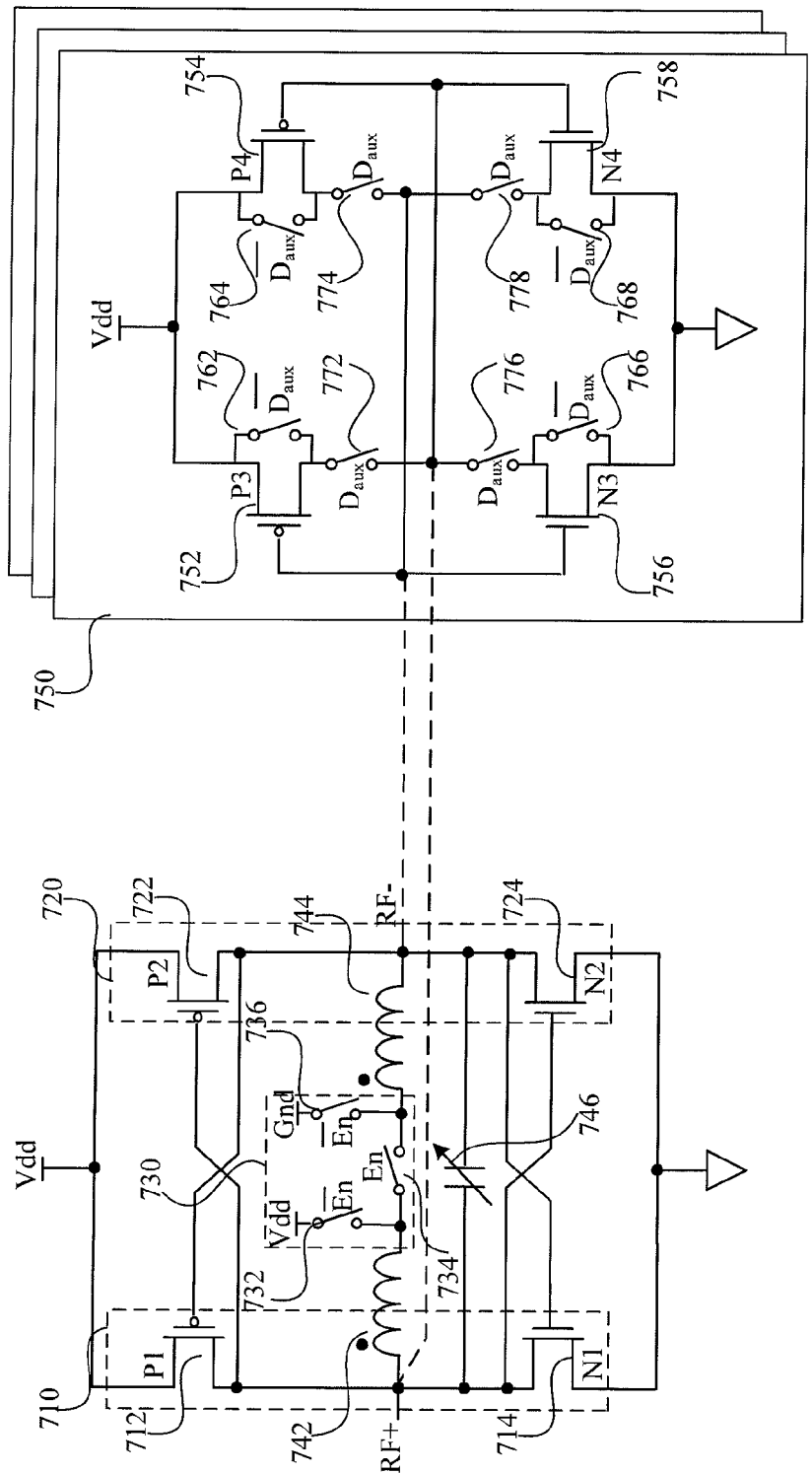
FIG. 7 shows an oscillator circuit with auxiliary core circuits, consistent with one or more embodiments of the present disclosure.

FIG. 7 shows a fourth example oscillator circuit, consistent with one or more embodiments of the present disclosure. The oscillator includes a capacitive circuit 746, an inductive circuit having inductive elements 742 and 744, a switching circuit 730, and cross-coupled inverter circuits 710 and 720 configured and arranged as described with reference to the capacitive circuit 446, the inductive elements 442 and 444, the switching circuit 430, and the cross-coupled inverter circuits 410 and 420 shown in FIG. 4.

As previously described, the self-resonant frequency of a LC circuit formed by the capacitive circuit 746 and the inductive elements 742 and 744 is primarily determined by the amount of capacitance provided by capacitive circuit 746 and the inductance provided by the inductive circuit 742 and 744. Specifically, the self-resonant frequency f0 of the LC circuit in Hertz is given by:

$$f_0 = \frac{1}{2\pi\sqrt{LC}}$$

where L is the inductance provided by the inductive circuit and C is the capacitance provided by the capacitive circuit. The oscillating frequency of the oscillator may be adjusted by adjusting L, C, or both. In this example, the oscillator circuit includes a variable capacitance circuit 746 that may be programmed to provide various different capacitance values, such as through the use of switched capacitive banks. In this manner, the variable capacitance circuit 746 may be adjusted to configure the oscillator circuit to operate at various different frequencies. Additionally or alternatively, the oscillator circuit may include a variable inductive circuit that may be programmed to provide a variable inductance.

As previously described, the inverters formed by transistors 712, 714, 722, and 724 are configured to follow and reinforce the oscillation of the LC circuit. Reinforcing of the oscillation signal by the inverters helps to maintain the oscillation and amplitude when using the oscillation signal to drive load circuits. Various embodiments recognize that the RF signal amplitude at steady state may not correspond to the pre-charged voltage for the capacitive circuit 746. For instance, assuming that the pre-charged voltage remains fixed, changes to the oscillation frequency will result in the differences between the pre-charged voltage and the amplitude of oscillation at different frequencies. This can result in a difference between the amplitude at startup and the steady-state amplitude of the RF signal. Accordingly, a plurality of auxiliary circuits can be provided to compensate for this mismatch by increasing the reinforce current. For example, enabling more cores has the effect of increasing the effective transistor widths of the main core, therefore increasing the reinforcement of the current during oscillation. This has a similar effect as increasing the biasing current for designs that include a biasing transistor. Thus, more auxiliary cores can be enabled to compensate for a reduction in oscillator amplitude due to a decrease in frequency. In the example shown in FIG. 7, the circuit includes a plurality of auxiliary circuits 750. Each of the auxiliary circuits 750 is configured to provide voltage biasing, in response to being enabled (e.g., in response to control signal $D_{aux}$), that adjusts the transconductance provided to the LC circuit. In this example, each auxiliary circuit 750 includes a set of transistors 752, 754, 756, and 758 configured to adjust transconductance provided to the LC circuit, relative to transconductance provided only by transistors 712, 714, 722, and 724, when the auxiliary circuit 750 is enabled.

The auxiliary circuit 750 includes a first set of switches 772, 774, 776, and 778 configured to electrically connect each of the transistors 752, 754, 756, and 758 in parallel with respective transistors 712, 714, 722, and 724 when the auxiliary circuit 750 is enabled. When the auxiliary circuit 750 is disabled, the first set of switches 772, 774, 776, and 778 disconnect the transistors 752, 754, 756, and 758 from the transistors 712, 714, 722, and 724. The auxiliary circuit 750 includes a second set of switches 762, 764, 766, and 768 configured to couple the source of each of the transistors 752, 754, 756, and 758 to the drain of the transistors when the auxiliary circuit 750 is disabled. When the auxiliary circuit 750 is enabled, the 762, 764, 766, and 768 uncouple the source of each of the transistors 752, 754, 756, and 758 from the drain of the transistors.

The disclosed examples and embodiments may be adapted for use in a variety of applications utilizing oscillator circuits. As previously indicated, the examples and embodiments may be particularly applicable to applications that duty-cycle oscillator circuits.

Figure 8:
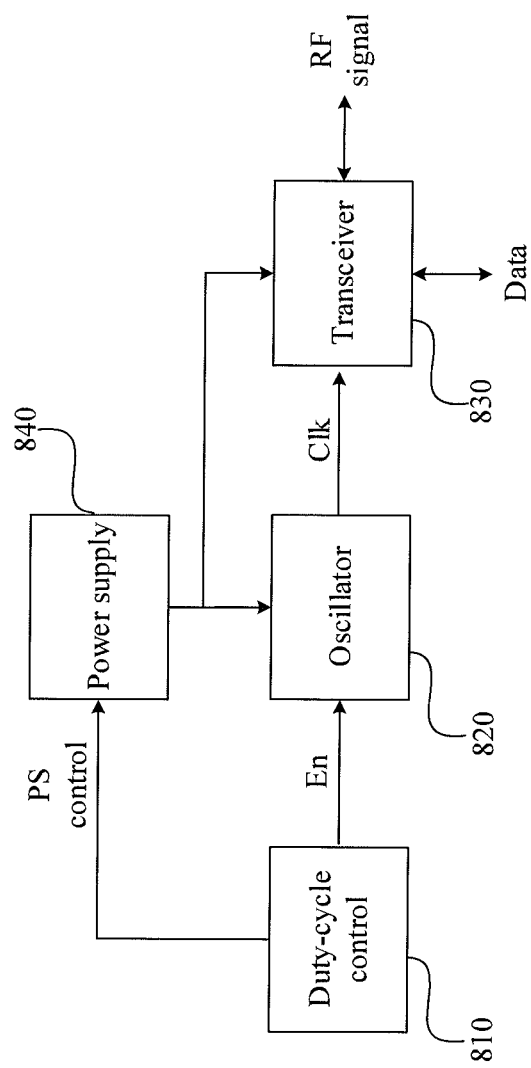
FIG. 8 shows a communication system configured for duty-cycled operation, consistent with one or more embodiments of the present disclosure.

As an illustrative example, FIG. 8 shows a communication system configured for duty-cycled operation. The communication system 800 includes a transceiver circuit 830 configured to transmit and receive RF signals using an oscillation signal derived from an oscillator circuit 820. For instance, the transceiver circuit 830 may utilize the oscillation signal to control the sampling of a transmission medium or to generate an RF signal for transmission over the transmission medium. The oscillator circuit may be implemented, for example, using circuits shown in FIGS. 1, 2, 4, and/or 7. In this example, the oscillation signal is depicted as being generated directly from the oscillator circuit 820. In some implementations, the communication system may include various additional circuits for processing the oscillation signal output by the oscillator circuit 820 before it is provided to the transceiver 830. As one example, the communication system 800 may include a phase-locked loop (PLL) (not shown) configured to prevent phase drift in the oscillation signal. As another example, the communication system 800 may include a frequency divider configured to generate a second signal oscillating at a lower frequency.

The communication system 800 includes a duty-cycle control circuit 810 configured to duty-cycle the oscillator circuit 820 when the transceiver circuit 830 is idle. In some embodiments, the transceiver circuit 830 may include a pulse-based transmitter (e.g., an IR-UWB transmitter) configured to transmit data using short pulses. An IR-UWB transmitter may encode data using various modulation schemes including, for example, PSK, ASK, FSK, or PPM. Similarly, the transceiver circuit 830 may include a pulse-based receiver (e.g., an IR-UWB receiver) configured to receive data encoded in pulses of a RF signal.

The duty-cycle control circuit 810 may be configured to operate the oscillator circuit 820 in an inactive or powered-down state when the pulse-based transmitter is inactive (e.g., between transmitted pulses). In some embodiments, the duty-cycle control circuit 810 may also duty-cycle operation of various other circuits including, for example, a power supply 840 used to power the oscillator circuit 820 and/or transceiver circuits 830.

The duty-cycle control circuit may alternate between operating the oscillator circuit 820 in a first inactive state and a second active state, for example, using the process shown in FIG. 3. For instance, the duty-cycle control circuit 810 may power down the LC circuit and inverter circuits of the oscillator 820 during a time when the RF signal is not used (e.g., between pulses of the RF signal). The duty-cycle control circuit 810 may power down the LC circuit and inverter circuits, for example, by disabling the power supply 840. The duty-cycle control circuit 810 can power up an LC circuit and inverter circuits of the oscillator 820 during a time when the RF signal is used to generate data pulses for transmission. As described with reference to FIG. 3, powering up the LC circuit and inverter circuits may include setting a switching circuit included in an inductive circuit of the LC circuit to operate in the first mode that prevents oscillation and charges the LC circuit after the power supply 840 is enabled. After charging the LC circuit and in response to a request to power up the oscillator, for example, the switching circuit is set to operate in the second mode.

Figure 9:
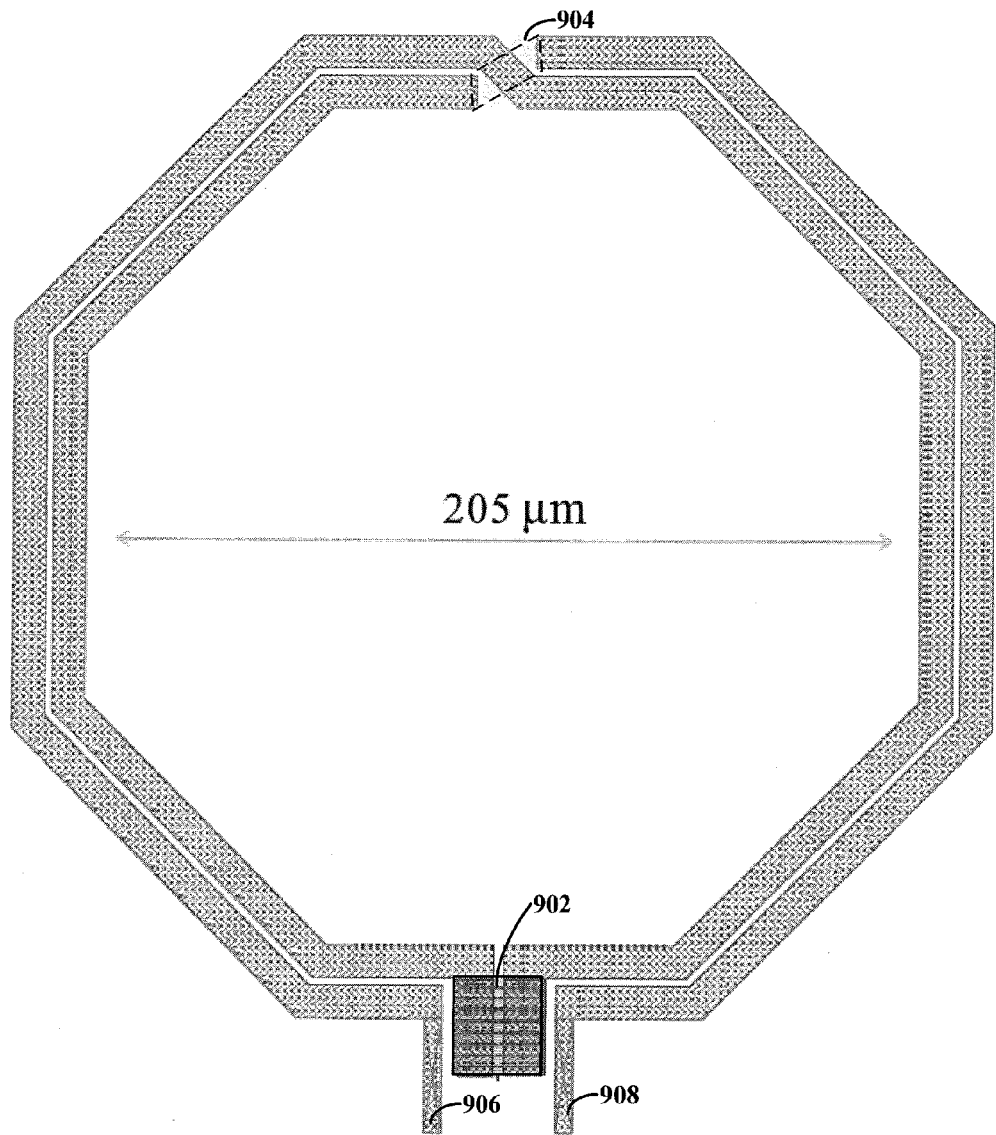
FIG. 9 depicts a physical layout of a split two-turn inductor with center switch, consistent with embodiments of the present disclosure.

FIG. 9 depicts a physical layout of a split two-turn inductor with center switch, consistent with embodiments of the present disclosure. Contact points 906 and 908 represent respective ends of two turns, or inductive elements, of the inductive circuit shown in FIG. 9. The opposing ends of the two inductive elements can be selectively connected to one another through a switching circuit 902. Location 904 shows a portion of one of the inductive elements that can be located on a different layer of the IC backend metallization for the circuit. The particular shape, dimensions and configuration for the inductive circuit shown in FIG. 9 can be modified according to parameters of the desired application (e.g., operating frequency range, desired quality factor, physical space considerations, and other considerations).

Figure 10:
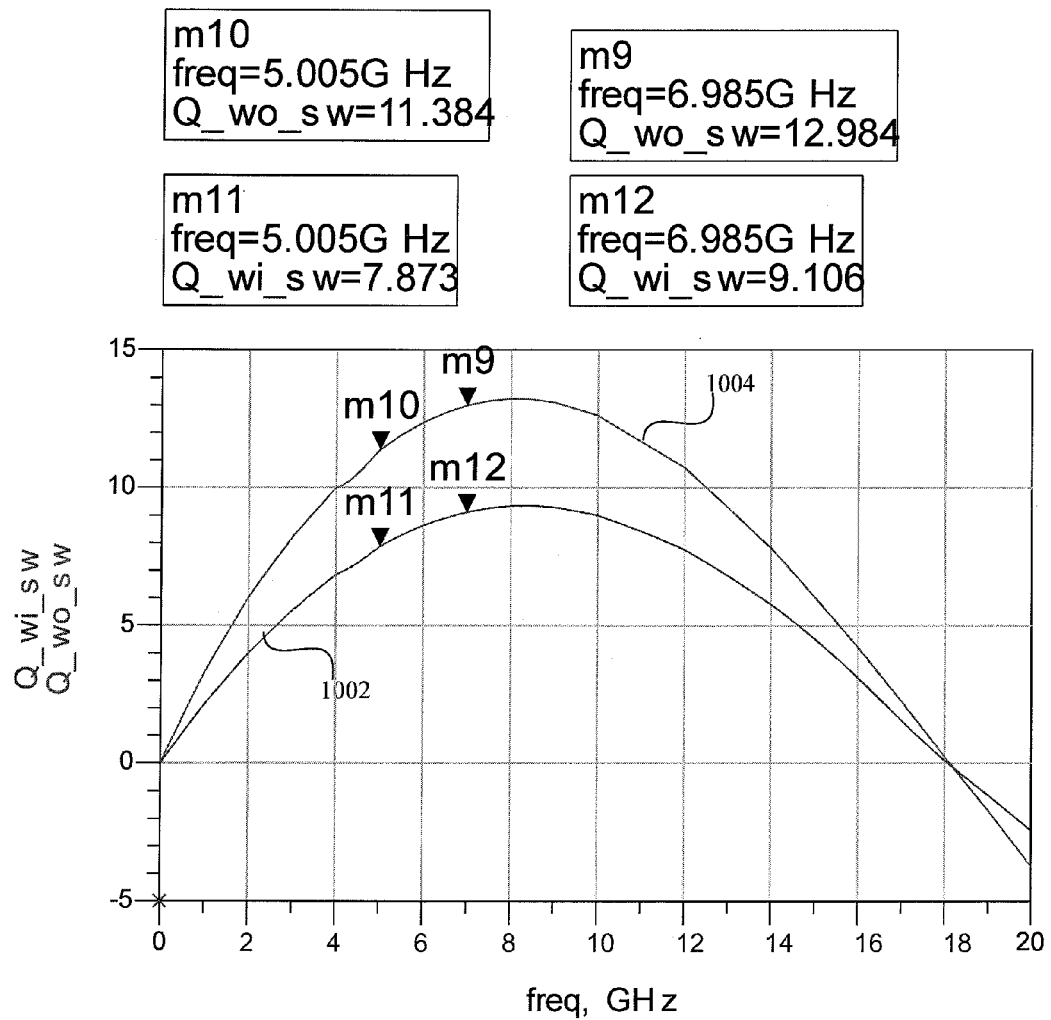
FIG. 10 shows a simulated quality factor of the conductor arrangement shown in FIG. 9 in comparison to an inductor arrangement of similar dimensions without a switch in between the two inductors loops.

FIG. 10 shows a simulated quality factor of the conductor arrangement shown in FIG. 9 in comparison to an inductor arrangement of similar dimensions without a switch in between the two inductor loops. Curve 1002 shows the quality factor of the inductor arrangement shown in FIG. 9 having a switch in between the two inductor loops. Curve 1004 shows quality factor of an inductor arrangement without a switch in between the two inductor loops. Simulation results, shown in TABLE 1, of a complementary class-B LC oscillator used with the two-turn inductor of FIG. 9 suggest that quality factor is not significantly affected by the inclusion of the switch circuit 902. The simulation results also suggest that the phase noise is over 30 dB lower than a comparable ring oscillator at frequencies around 5 GHz. The following table shows a summary of the simulation results relative to power and phase noise (PN):

TABLE 1

| | Frequency (GHz) | |
|---|---|---|
| | 4.94 | 7.09 |
| Power (µW) | 1290 (auxiliary: 571) | 643 |
| PN (dBc/Hz) | −109.4 @ 1 MHz | −105.3 @ 1 MHz |
| | −130.4 @ 10 MHz | −127.3 @ 10 MHz |

Various blocks, modules or other circuits may be implemented to carry out one or more of the operations and activities described herein and/or shown in the figures. In these contexts, a "block" (also sometimes "logic circuitry" or "module") is a circuit that carries out one or more of these or related operations/activities (e.g., enabling/preventing oscillation, charging capacitive circuits, or controlling duty-cycled operation of circuits). For example, in certain of the above-discussed embodiments, one or more modules are discrete logic circuits or programmable logic circuits that are configured and arranged for implementing these operations/activities, as in the circuit modules shown in FIGS. 1-4 and 7-8. In certain embodiments, such a programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions. Certain embodiments are directed to a computer program product (e.g., nonvolatile memory device), which includes a machine or computer-readable medium having stored thereon instructions which may be executed by a computer, system-on-chip, programmable IC, or other electronic device to perform these operations/activities.

Based upon the above discussion and illustrations, those skilled in the art will readily recognize that various modifications and changes may be made to the various embodiments without strictly following the exemplary embodiments and applications illustrated and described herein. For instance, although aspects and features may in some cases be described in individual figures, it will be appreciated that features from one figure can be combined with features of another figure even though the combination is not explicitly shown or explicitly described as a combination. Such modifications do not depart from the true spirit and scope of various aspects of the invention, including aspects set forth in the claims.

What is claimed is:

1. An apparatus, comprising:
an LC circuit including a capacitive circuit and an inductive circuit connected in a circuit loop with a first end of the capacitive circuit coupled to a first node and a second end of the capacitive circuit coupled to a second node; and
wherein the inductive circuit includes
one or more inductive elements including a first inductor coil and a second inductor coil, and
a switching circuit coupled to the inductive circuits and configured and arranged to
in a first mode, provide a direct-current (DC) charge voltage across the LC circuit and prevent oscillation of energy between the capacitive circuit and the inductive circuit by opening a switch in the circuit loop of the LC circuit, and
in a second mode, enable oscillation of energy between the capacitive circuit and the inductive circuit by closing the switch in the circuit loop,
wherein the switching circuit includes a first switch to couple the first inductor coil element and the second inductor coil, a second switch to couple the first inductor coil to a power terminal and a third switch to couple the second inductor coil to a ground terminal.

2. The apparatus of claim 1, further comprising an amplifier circuit coupled to the LC circuit and configured and arranged to sustain the oscillation of the LC circuit.

3. The apparatus of claim 2, wherein the amplifier circuit includes:
a first inverter circuit having a first input coupled to the first node and a first output coupled to the second node; and
a second inverter circuit having a second input coupled to the first output and a second output coupled to the first input.

4. The apparatus of claim 2, wherein:
the first inductor coil having a first end coupled to the first node and a second end coupled to the switching circuit, and
the second inductor coil magnetically coupled with the first inductor coil and having a first end coupled to the second node and a second end coupled to the switching circuit; and
the switching circuit is further configured and arranged to:
in the first mode, uncouple a second end of the first inductor coil from the second end of the second inductor coil, couple the second end of the first inductor coil to a first power terminal, and couple the second end of the second inductor coil to a second power terminal; and
in the second mode, uncouple the second end of the first inductor coil from the first power terminal, uncouple the second end of the second inductor coil from the second power terminal, and couple the second end of the first inductor coil to the second end of the second inductor coil.

5. The apparatus of claim 4, wherein:
the switching circuit is configured and arranged to operate in the first mode in response to a first control signal and operate in the second mode in response to a second control signal; and
the switching circuit includes
the first switch configured and arranged to couple to the second end of the first inductor coil to the second end of the second inductor coil in response to the second control and to uncouple the second end of the first inductor coil from to the second end of the second inductor coil in response to the first control signal;
second switch configured to couple the second end of the first inductor coil to the first power terminal in response to the first control signal and to uncouple the second end of the first inductor coil from the first power terminal in response to the second control signal; and
the third switch configured to couple the second end of the second inductor coil to the second power terminal in response to the first control signal and to uncouple the second end of the second inductor coil from the second power terminal in response to the second control signal.

6. The apparatus of claim 4, further comprising
a communication circuit coupled to the first and second nodes and configured and arranged to generate an impulse radio frequency (RF) signal; and
a duty-cycle control circuit coupled to the switching circuit and configured and arranged to:
power down the LC circuit and the amplifier circuit when RF impulses of the impulse RF signal are not being communicated; and
power up the LC circuit and the amplifier circuit during communication of RF impulses of the impulse RF signal.

7. The apparatus of claim 6, further comprising
a power supply configured to provide a voltage to the first power terminal when enabled;
wherein the duty-cycle control circuit is configured and arranged to:
power down the LC circuit and the amplifier circuit by disabling the power supply; and
power up the LC circuit and the amplifier circuit by
setting the switching circuit to operate in the first mode, enabling the power supply, and after enabling the power supply, setting the switching circuit to operate in the second mode.

8. The apparatus of claim 6, wherein:
the RF signal is a pulse-based data signal that encodes a set of input data using an impulse radio ultra wide band modulation.

9. The apparatus of claim 3, wherein
each of the first and second inverter circuits includes a P-type transistor having a source coupled to a first power terminal, and an N-type transistor having a drain coupled to a drain of the P-type transistor and a source coupled to a second power terminal; and
further comprising an auxiliary circuit configured to increase the transconductance relative to of each of the inverter circuits.

10. The apparatus of claim 9, wherein the auxiliary circuit includes a plurality of stages, each stage having
a respective set of transistors including two p-type transistors and two N-type transistors; and
a respective first set of switches configured to
when enabled, electrically connect each N-type transistor of the set of transistors in parallel with the N-type transistor of a respective one of the first and second inverter circuits and electrically connect each P-type transistor of the set of transistors in parallel with the P-type transistor of a respective one of the first and second inverter circuits; and
when disabled, electrically disconnect the set of transistors from the first and second inverter circuits.

11. The apparatus of claim 10, wherein
each of the plurality of stages includes a respective second set of switches including, for each of the set of transistors, a respective switch configured to couple a source of the transistor to a drain of the transistor when enabled and uncouple the source of the transistor from the drain of the transistor when disabled.

12. The apparatus of claim 1, wherein the capacitive circuit includes a switched capacitor bank configured and arranged to adjust a self-resonant frequency of the LC circuit.

13. A method, comprising:
in a first mode,
preventing oscillation of an LC circuit, including a capacitive circuit and an inductive circuit connected in a circuit loop, by opening a switch in the circuit loop of the LC circuit, and
using a first switch, a second switch and a third switch coupled to the inductive circuit, charging the capacitive circuit by providing a charge voltage across the LC circuit; and
in a second mode, enabling oscillation of the LC circuit by closing the switch in the circuit loop, wherein the charge on the capacitive circuit causes the LC circuit to oscillate at a single-ended peak-to-peak amplitude that equals the pre-charged voltage of the capacitive circuit nearly instantaneously.

14. The method of claim 13, wherein
the oscillation of the LC circuit generates an oscillating signal at first and second nodes coupled to respective ends of the capacitive circuit; and
further comprising, using the oscillating signal, driving the oscillation of a pair of cross-coupled inverter circuits, a first inverter circuit of the pair having an input coupled to an output of a second inverter circuit of the pair and an output coupled to an input of the second inverter circuit of the pair.

15. The method of claim 14, further comprising:
magnetically coupling a first inductor coil in the inductive circuit to a second inductor coil in the inductive circuit, the first inductor coil having a first end coupled to the first node and a second end coupled to the switch in the circuit loop, and the second inductor coil having a first end coupled to the second node and a second end coupled to the switch in the circuit loop;
in the first mode,
uncoupling a second end of the first inductor coil from the second end of the second inductor coil,
coupling the second end of the first inductor coil to a first power terminal, and
coupling the second end of the second inductor coil to a second power terminal; and
in the second mode,
uncoupling the second end of the first inductor coil from the first power terminal,
uncouple the second end of the second inductor coil from the second power terminal, and
coupling the second end of the first inductor coil to the second end of the second inductor coil.

16. The method of claim 15, further comprising
powering down, in response to a first control signal, the LC circuit, the first inverter circuit, and the second inverter circuit by disabling a power supply configured to provide a regulated voltage difference between the first and second power terminals; and
powering up, in response to a second control signal, the LC circuit, the first inverter circuit, and the second inverter circuit by
operating in the first mode, and
enabling the power supply; and
after enabling the power supply, operating in the second mode.

17. The method of claim 14, further comprising
transmitting a radio frequency (RF) signal having a first portion that includes the oscillating signal and having a second portion in which the oscillating signal is absent;
powering down the LC circuit, the first inverter circuit, and the second inverter circuit, during the transmitting of the second portion; and
powering up the LC circuit, the first inverter circuit, and the second inverter circuit, during the transmitting of the first portion.

18. The method of claim 17, wherein the RF signal is an impulse radio ultra wide band signal.

19. The method of claim 14, further comprising
receiving an radio frequency (RF) signal by sampling a transmission medium using the oscillating signal;
powering down the LC circuit, the first inverter circuit, and the second inverter circuit, in a first time period when the RF is absent on the transmission medium; and
powering up the LC circuit, the first inverter circuit, and the second inverter circuit, in a second time period in which the RF signal is present on the transmission medium.

20. The method of claim 14, further comprising: using an auxiliary circuit coupled to the first and second inverter circuits, adjusting a transconductance provided to the LC circuit.

* * * * *